United States Patent [19]

Sharp

[11] Patent Number: 4,747,922
[45] Date of Patent: May 31, 1988

[54] CONFINED ION BEAM SPUTTERING DEVICE AND METHOD

[75] Inventor: Donald J. Sharp, Albuquerque, N. Mex.

[73] Assignee: The United States of America as represented by the United States Department of Energy, Washington, D.C.

[21] Appl. No.: 844,035

[22] Filed: Mar. 25, 1986

[51] Int. Cl.⁴ .............................................. C23C 14/46
[52] U.S. Cl. .......................... 204/192.11; 204/192.34; 204/298
[58] Field of Search ............... 204/298, 192 R, 192 N, 204/164, 192.11, 192.12, 192.31, 192.3, 192.32, 192.34

[56] References Cited

U.S. PATENT DOCUMENTS

| | | | |
|---|---|---|---|
| 3,391,071 | 7/1968 | Theuerer | 204/192 R |
| 3,409,529 | 11/1968 | Chopra et al. | 204/192 R |
| 3,472,751 | 10/1969 | King | 204/192 R |
| 3,487,000 | 12/1969 | Hajzak | 204/298 |
| 3,492,215 | 1/1970 | Conant | 204/298 |
| 3,528,387 | 9/1970 | Hamilton | 204/298 X |
| 4,142,958 | 3/1979 | Wei et al. | 204/298 X |
| 4,250,009 | 2/1981 | Cuomo et al. | 204/298 X |
| 4,278,493 | 7/1981 | Petvai | 204/298 X |
| 4,361,472 | 11/1982 | Morrison, Jr. | 204/298 X |
| 4,381,453 | 4/1983 | Cuomo et al. | 204/298 X |
| 4,424,103 | 1/1984 | Cole | 204/298 X |
| 4,450,031 | 5/1984 | Ono et al. | 204/298 X |
| 4,492,620 | 1/1985 | Matsuo et al. | 204/192 R |

OTHER PUBLICATIONS

Maissel et al., "Handbook of Thin Film Technology", chs. 3 and 4, pp. 3-1 to 4-44, McGraw-Hill.

*Primary Examiner*—John F. Niebling
*Assistant Examiner*—Nam X. Nguyen
*Attorney, Agent, or Firm*—Anne D. Daniel; James H. Chafin; Judson R. Hightower

[57] ABSTRACT

A hollow cylindrical target, lined internally with a sputter deposit material and open at both ends, surrounds a substrate on which sputtered deposition is to be obtained. An ion beam received through either one or both ends of the open cylindrical target is forced by a negative bias applied to the target to diverge so that ions impinge at acute angles at different points of the cylindrical target surface. The ion impingement results in a radially inward and downstream directed flux of sputter deposit particles that are received by the substrate. A positive bias applied to the substrate enhances divergence of the approaching ion beams to generate a higher sputtered deposition flux rate. Alternatively, a negative bias applied to the substrate induces the core portion of the ion beams to reach the substrate and provide ion polishing of the sputtered deposit thereon.

11 Claims, 2 Drawing Sheets

CONFINED ION BEAM SPUTTERING DEVICE AND METHOD

The U.S. Government has rights in this invention pursuant to contract No. DE-AC04-76DP00789 between the U.S. Department of Energy and AT&T Technologies, Inc.

TECHNICAL FIELD

This invention relates generally to ion beam sputtering devices and methods for operating the same and, more particularly, to such apparatus and methods for obtaining high deposition rates and improved uniformity of sputtered deposition by target confinement of the ion beam.

BACKGROUND OF THE INVENTION

There are many commercial applications of ion sputtering, in which highly energized particles impinging upon a target cause dislodgement of the target material, either as individual atoms or clusters of atoms, for subsequent deposition as a thin film on a substrate. A variety of techniques are known and practiced for generating and carefully directing the energetic particles, e.g., typically ions of noble gases such as argon, neon or xenon, by carefully applied electrostatic fields either to remove surface impurities from a substrate for cleaning or to sputter off material from a target to deposit the material onto a clean substrate.

U.S. Pat. No. 3,528,387, to Hamilton, discloses an apparatus in which ions of an inert gas are emitted into a deposition vacuum chamber through a small port generally aligned toward the substrate. The ions bombard the substrate to clean its surface prior to deposition, or bombard the substrate during or after a deposition step involving evaporation of the material to be deposited on the substrate.

Apparatus and techniques for producing a thin film deposit on a substrate are shown, for example, in U.S. Pat. No. 4,424,103, to Cole, wherein a target is bombarded obliquely with a linear ion gun. Sputtered target material is sprayed onto moving substrates are to obtain the desired deposits thereon.

A broad ion beam is deflected and focused by means of electrostatic fields in U.S. Pat. No. 4,381,453, to Cuomo et al, and in U.S. Pat. No. 4,250,009, also to Cuomo et al, careful control of such biasing electrostatic fields can be utilized to selectively direct positive or negative ions to a substrate.

Conventional ion guns typically utilize a noble gas to produce a glow discharge from which ions are selectively extracted and accelerated to form an ion beam. Such ion guns, however, have current density limitations which make them unsuitable for employment in certain demanding vacuum processing, cleaning and sputter deposition operations. The use of a magnetron plasma source, wherein a plasma formed between two electrostatic field defining surfaces is ejected energetically toward the target element to be sputtered, is taught in U.S. Pat. No. 4,361,472, to Morrison, Jr. as an alternative ion source.

A need therefore exists for apparatus and techniques that will permit the use of a conventional, inexpensive ion source, e.g., ion gun, for rapid cleaning of substrates or the deposition of thick sputtered deposits thereon in a uniform and smooth distribution. Particularly where sputtered coatings are being considered for use as a cladding on deuterium filled microballoon fuel elements for nuclear energy applications, a smooth and uniform amorphous coating is required to prevent anomalous collapse during implosion. Even where relatively slow deposition rates by known techniques can be tolerated, the slow deposition rates allow residual vacuum system contaminants such as oxygen and carbon to codeposit with the sputtered material in the deposited film. Finally, the controlled effluence of some energetic ions onto the substrate surface during deposition is found to provide deposits with fine crystalline structures that are highly desirable for certain applications. It is therefore desirable to have in a single apparatus the flexibility to control high deposition rates and controlled ion bombardment during deposition, and to obtain sputtered deposition substantially all around a substrate, e.g., a round or spherical object.

SUMMARY OF THE INVENTION

It is an object of this invention to provide apparatus for fast deposition of a sputtered material to a substantially uniform thickness on a substrate.

It is another object of this invention to provide apparatus for the deposition of a sputtered material at a high rate, to a substantially uniform deposit thickness, wherein the deposited material has a small grain size.

It is another object of this invention to provide apparatus for sputtered deposition of a material at a high rate and a substantially uniform deposition thickness of a small grain size and with a circular symmetry of deposition.

It is yet another object of this invention to provide sputtered deposition of a material, at a high flux density, to a substantially uniform deposit thickness of a small grain size, with a circular symmetry on opposite sides of a substrate.

It is an even further object of this invention to provide apparatus for sputtered deposition of material at a high flux rate, generated by the simultaneous operation of two ion sources.

It is also an object of this invention to provide apparatus for sputtered deposition of material at a high flux rate uniformly on moving substrates located between two ion beams.

Another more general objective of this invention is to provide apparatus for the simultaneous sputtered deposition of material with ion bombardment of the sputtered deposit on one or both sides of a given substrate.

It is also an object of this invention to provide a method for obtaining a thick, substantially uniform, fast deposit of a fine grained sputtered deposited material on one or both sides of a substrate with circular symmetry.

These and other objects of this invention are realized by the provision of apparatus in which one or more ion source beams providing ion beams of controlled flux density are received through one or both ends of an open cylindrical target. The cylindrical target and substrate are biased selectively for sputtering target material onto the substrate or polishing the substrate surface.

In accordance with one embodiment of the invention, an ion beam is directed into the cylindrical target from one end. With the target biased negatively, the ion beam is diverged into contact with the surface of the target to sputter target material onto the substrate. A positive bias applied to the substrate further diverges the ion beam to enhance target sputtering. A negative bias applied to the substrate, however, attracts free ions in the cylinder while it receives sputtered target material to the substrate. With the target at ground potential and the substrate biased negatively, the ion beam impinges directly onto the substrate to sputter material therefrom and thereby clean the substrate.

In another embodiment, two angled ion beams, one directed into each end of the cylindrical target, are utilized to obtain a very high deposition rate of sputtered material onto a flat substrate placed within the cylindrical target.

The above and still further objects, features and advantages of the present invention will become apparent upon consideration of the following detailed description of several specific embodiments thereof, especially when taken in conjunction with the accompanying drawings.

BEST MODE FOR PRACTICING THE INVENTION

Figure 1:
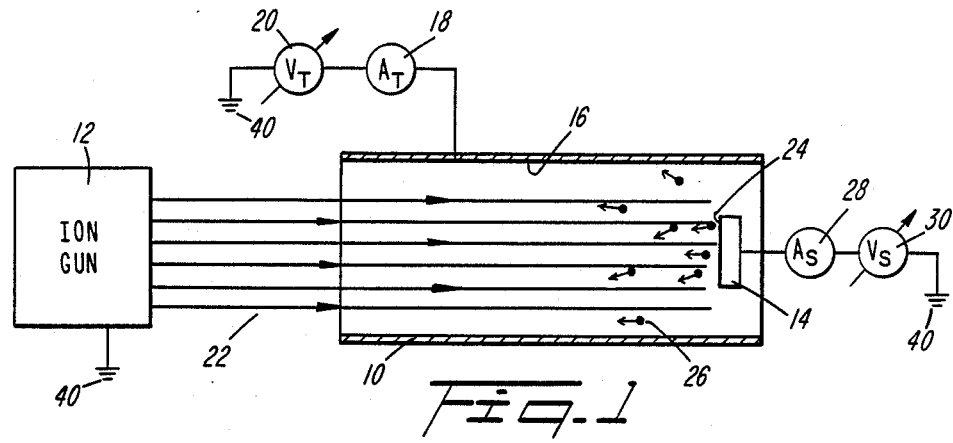
FIG. 1 is a vertical cross-sectional schematic view of a preferred embodiment of this invention utilizing a single ion gun for cleaning a substrate.

In FIG. 1, a hollow cylindrical target 10 is open at both ends and is placed to receive an ion beam 22 from an ion gun 12. A substrate 14 is supported within target 10 intermediate its open ends.

The substrate 14 is biased by a voltage source 30 and the target 16 is biased by source 20. Conventional current measuring means 18 are provided to measure target current $I_T$, and, similarly, a conventional current measuring means 28 is employed to measure the substrate current $I_S$. The ion gun 12, the target 10, and the substrate 14 are all maintained at a relatively low pressure in a vacuum chamber (not shown for simplicity) and conventional means are provided for establishing and controlling the vacuum environment therein.

The apparatus of this invention can be utilized to clean the surface of a substrate, e.g. preparatory to sputter deposition thereon, without need for the user to handle the substrate between cleaning and sputter deposition. For such a use, as best seen with reference to FIG. 1, the target bias voltage $V_T$ is set equal to ground potential and the substrate bias voltage $V_S$ is set to be negative with respect to ground 40. As a result, ion beam 22 unaffected by the target 10 and impinges directly on the front surface 24 of substrate 14. The impingement of ion beam 22 on surface 24 causes the sputtering of small particles 26 of matter from the surface, either as individual atoms or as small clusters of atoms. The rate at which matter is thus sputtered away from the front surface 24 of substrate 14 is determined in part by the flux density of the ion beam 22, which is controlled by the conventional ion gun 12, and also by the positive bias $V_S$ provided by means 30. The particles 26 sputtered away from surface 24 of substrate 14 are deposited either on the inner surface 16 of cylindrical target 10 or are carried away by the vacuum system (not shown in FIG. 1 for simplicity) maintaining a vacuum within the chamber surrounding target 10 and substrate 14.

Figure 2:
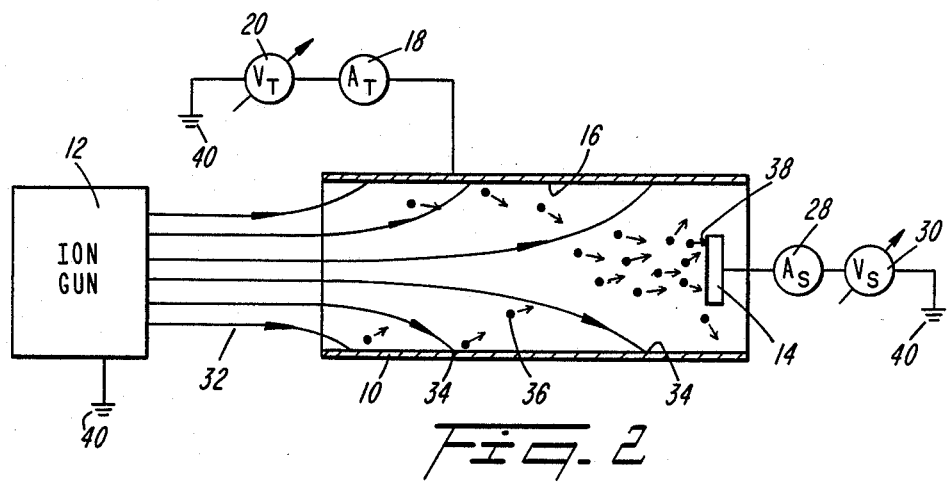
FIG. 2 is a vertical cross-sectional schematic view of a preferred embodiment of this invention using a single ion gun to sputter deposit material on a flat substrate.

Referring now to FIG. 2, sputtered deposition of material from the internal cylindrical surface 16 of target 10 onto surface 38 of substrate 14 is obtained by providing a negative bias $V_T$ to the target, with substrate 14 applied with a bias voltage $V_S$ that is either at ground potential or positive with respect to ground 40. In this context, ion gun 12 directs a cylindrical ion beam 32 into an open end of hollow cylindrical target 10 and to be diverged by the negatively charged electric field within. This ion beam divergence causes individual ions to impinge at acute angles upon the inner cylindrical surface 16 at impingement points 34 to cause small particles 36 of sputtered material to be released therefrom. The impinging positively charged ions release their positive charge and become neutral atoms of the noble gas from which the ion beam was initially produced. These gas atoms eventually migrate downstream through target 10 and are removed by the vacuum maintaining system.

The physics of the sputtering mechanism is such that the particles 36 of the sputtered material, dislodged from the inner surface 16 of target 10, propagate away from internal surface 16 and downstream with respect to target 10 and ion beam 32. See, for example, Chs 3 and 4, at pp. 3-1 to 4-44 of the Handbook of Thin Film Technology, McGraw Hill, by Leon I. Maissel and Reinhard Glang.

By the selection of a cylindrical "ion beam confining" geometry of surface 16, an initially parallel ion beam 32 is then employed to generate a flux of inwardly converging and downstream-directed particles 36 of a sputtered material that impinges on surface 38 of substrate 14. These particles of impinging sputtered material 36 form a deposit of sputtered material on surface 38 of substrate 14, at a rate determined by the flux density of ion beam 32, the negative bias $V_T$ applied to target and the negative bias $V_S$ applied to substrate 14. As persons skilled in the art will readily appreciate, the internal cylindrical geometry of surface 16 compactly provides the advantage of a large area from which sputtered material particles 36 are released to be deposited on the substrate surface 38.

Depending on the negative bias $V_S$ provided to substrate 14, some of the sputtered material particles 36 may not become deposited on surface 38 but may continue downstream. Because sputtered material particles 36 are not electrically charged, they tend to migrate toward the surface 16 of target 10 downstream of substrate 14 to ultimately become deposited within the target. This is advantageous over conventional systems in which the sputtered material particles that are not actually deposited on the substrate deposit on the walls of the vacuum chamber surrounding the active elements and are not easily recoverable. This becomes an important factor when the sputtered material is expensive or otherwise difficult to recover.

Figure 3:
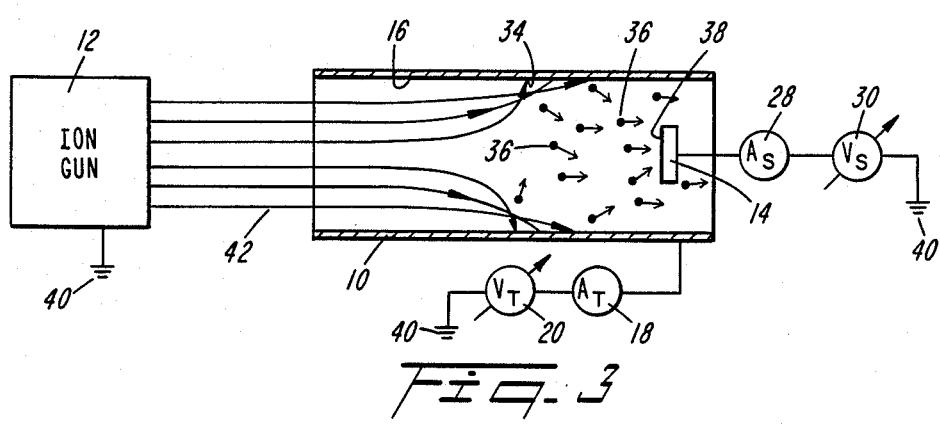
FIG. 3 is a vertical cross-sectional schematic view of the embodiment of FIG. 2, with a positively biased substrate.

If substrate 14 is provided with a positive bias voltage $V_S$, the positive electrostatic field generated in front of surface 38 of substrate 14 exerts a repulsive force on the positive ions approaching it. As best seen in FIG. 3, the provision of a strong positive bias $V_S$ to substrate 14 results in a combined electrostatic field which tends to strongly promote divergence of an ion beam 42 so that individual ions located towards the center of ion beam 42 are deflected the most. Depending on the noble gas utilized to generate ion beam 42 and on the material used to line inner surface 16 of target 10 to provide the sputtered material, such a strong positive biasing of substrate 14 may be beneficial. In other words, depending on the ion beam and the sputtered material involved, the operator of the apparatus of this invention may find it preferable to bias the target and the substrate to different degrees to obtain the desired sputtered material deposition rate on a given substrate.

It should be appreciated that the provision of a cylindrical target not only confines the ion beam so that virtually all the charged ions of the ion beam are receivable by the target but also releases the sputtered-off material particles in a preferred direction. Because the sputtered material is released inwardly all around the cylindrical surface, if the substrate 14 is not flat (as indicated in FIGS. 1-3), the sputtered material is deposited with greater uniformity azimuthally around the receptive surface of the substrate.

Figure 4:
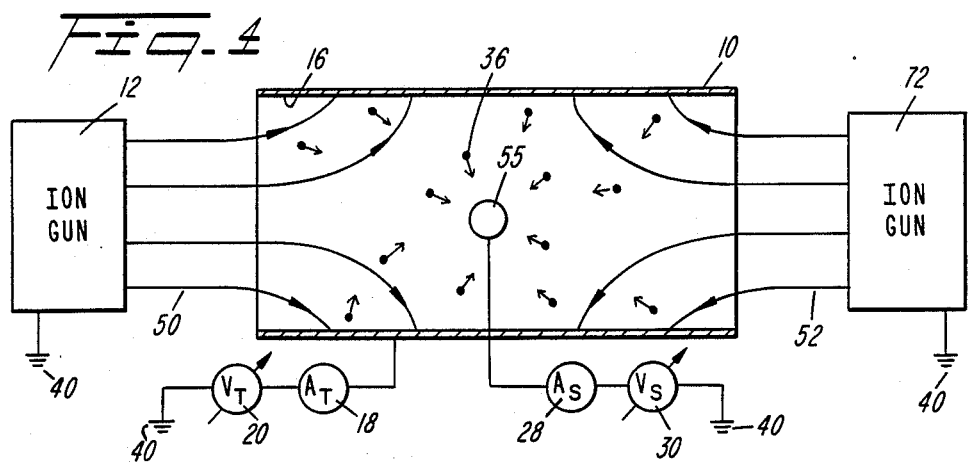
FIG. 4 is a vertical cross-sectional schematic view of a preferred embodiment of this invention with two ion guns for sputtered deposition of material onto a spherical substrate.

For certain applications it may be preferable to have sputtered deposition onto a spherical surface or with two-sided symmetry about a substrate. For such applications, as best seen with reference to FIG. 4, two ion guns, 12 and 72 direct two ion beams 50 and 52 respectively into opposite open ends of grounded target 10. The embodiment depicted in FIG. 4 thus has the capability to provide twice the total deposition rate as the embodiment depicted in FIGS. 1 through 3. The two ion gun embodiment is particularly expeditious in use for objects that have to be coated with sputtered depositions symmetrically. With target 10 biased negatively and with substrate 55 at either ground potential or a positive bias voltage sputtered material particles 36 are released from the cylindrical inner surface 16 of target 10 and arrive throughout and at both sides of substrate 55, as seen in FIG. 4.

Figure 5:
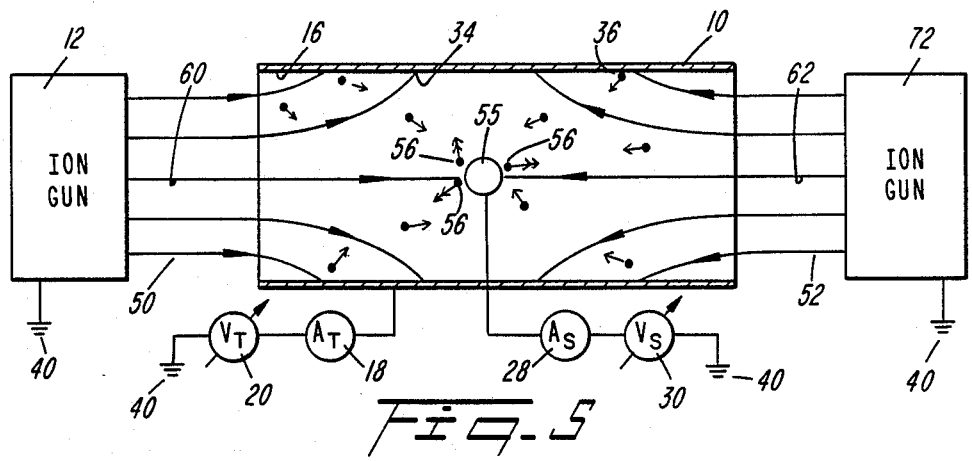
FIG. 5 is a vertical cross-sectional schematic view of the embodiment of FIG. 4, with a positive bias applied to the substrate.

It is generally believed that the impingement of positively charged ions onto a substrate during the sputtered deposition process generates fresh nucleation sites and facilitates the development of a fine crystalline structure in the sputtered deposit on the substrate. For applications where this would be desirable, as best seen in FIG. 5, by providing a somewhat negative voltage $V_S$, the central portions 60 and 62 of ion beams 50 and 52 respectively are attracted to substrate 55 even as particles 36 of the sputtered deposit material arrive at substrate 55. The result is that the impingement of ions from the central portions 60 and 62 of ion beams 50 and 52, respectively, causes a few of the previously sputter deposited particles, identified as particles 56 with double arrowheads in FIG. 5, to be released from the deposit on substrate 55. In this particular process, therefore, not all the sputtered material particles 36 that arrive at substrate 55 remain there, as some are removed by the impingement of ions in central portions 60 and 62 of the ion beams 50 and 52 respectively. This technique is sometimes referred to as ion beam polishing. It should be noted that ion beam polishing can be applied at any stage in the sputtered deposition process simply by altering the bias voltage $V_S$ of substrate 55 to be negative. The apparatus of this embodiment therefore allows for considerable flexibility in the amount of sputtered deposition obtained before ion polishing is applied.

Figure 6:
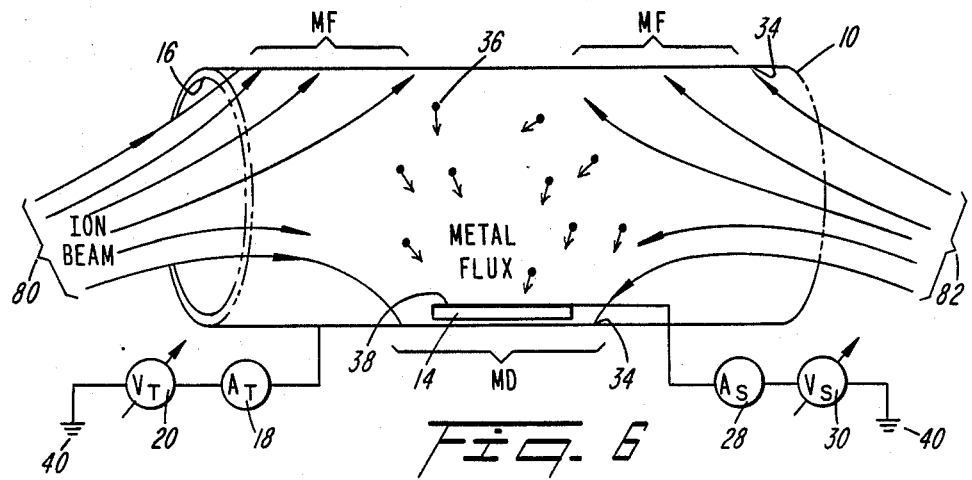
FIG. 6 is a schematic perspective view of an embodiment of this invention in which two intercepting ion beams are utilized to generate a high sputtered-deposition density onto a flat substrate.

There may be applications wherein a very high rate of sputtered deposition on a relatively flat substrate is desired. The two ion gun apparatus, as previously discussed with reference to FIGS. 4 and 5, can be modified as indicated in FIG. 6 so that the ion beams 80 and 82 are essentially coplanar but in a manner so as to intersect if they are not intercepted by inner surface 16 of target 10. Sputtered material particles 36 tend to migrate, as indicated in FIG. 6, away from the zones at which the positive ions impinge on a negatively charged inner surface 16 of substrate 10. Sputtered material particles 36 released in a flux from the zones identified as maximum flux (MF) zones migrate conveniently towards a diametrically opposite located zone maximum deposition zone (MD) to be deposited on surface 38 of substrate 14. As persons skilled in the art will appreciate, this particular scheme does not permit ion beam polishing, but it is particularly useful where a high rate of sputtered material deposition onto a relatively flat substrate is desired.

When high deposition rates are desired, and the system is operated for prolonged periods, e.g., 20 to 30 minutes, it is advisable to provide cooling for either or both the target cylinder and the substrate. This is most conveniently done, in the conventional manner, by providing either efficient thermally conductive supports to the cooled element or by providing heat pipes with internal evaporation and convectional heat transfer to an electrically insulated sink away from the objects to be cooled. Conventional cooling means of this type are readily available to persons skilled in the art and may be selected to best meet the specific needs of the user.

As noted previously, portions of the sputtered deposit that do not condense on the substrate recondense almost entirely on the inner walls of the cylinder, thereby conserving the sputtered deposit material. Other sputter coating techniques and configurations typically permit the majority of the sputtered material which does not strike the substrate to escape into the rest of the vacuum chamber. Another benefit may be realized due to the relatively enclosed nature of the volume in which the sputtered deposition takes place. Thus, reactive gases which coincidentally contaminate the vacuum system are "consumed" by being trapped by sputtered deposit material particles 36 that are recondensed onto the internal surface 16 of target 10 adjacent its open ends. Residual surrounding contaminants due to the cylindrical geometry of the target extending to each side of the substrate, do not have convenient diffusion access to the substrate as with other less enclosed systems.

It is expected that persons skilled in the art, upon an understanding of the preceding, will be able to practice this invention otherwise than as specifically described and disclosed herein. Modifications may, therefore, be made to the specific embodiments disclosed herein without departing from the scope of this invention and such modifications are intended to be included within the claims appended below.

What is claimed is:

1. A confined ion beam sputtering device comprising:
 a hollow cylindrical target having at least an inner wall surface of material selected for ion sputtering;
 a substrate supported within and electrically insulated from said cylindrical target;

a first ion beam source means at one end of the cylindrical target for generating a first ion beam and directing the beam axially into the hollow cylindrical target toward said substrate;

first biasing means for electrically biasing said substrate; and second biasing means for electrically biasing said cylindrical target independent of the first biasing means;

whereby ions entering the cylindrical target may be electrically deflected circumferentially to impinge on the inner wall surface of the target at acute angles for efficiently sputtering material therefrom for deposit on the substrate.

2. A confined ion beam sputtering device as set forth in claim 1, wherein the first and second biasing means are adjustable positively or negatively with respect to each other and to the charge of the ion beam.

3. A confined ion beam sputtering device as set forth in claim 1, and including a second ion beam source means at the opposite end of the cylindrical target for generating a second ion beam and directing the beam axially into the hollow cylindrical target toward said substrate.

4. A confined ion beam sputtering device as set forth in claim 3, wherein the first and second biasing means are adjustable positively or negatively with respect to each other and to the charge of the ion beam.

5. A method of sputter deposition of a substrate comprising the steps of:

positioning the substrate within a hollow cylindrical target lined with material to be sputtered;

directing an ion beam axially into the hollow cylindrical target toward said substrate; and electrically biasing the target and the substrate with respect to each other and the charge of the ion beam to divert the ion beam into impingement with the lined material of the target at acute angles for efficiently sputtering material therefrom for deposit on the subtrate.

6. The method according to claim 5, including directing two ion beams collinearly via opposite open ends of said target toward opposite sides of said substrate located therebetween.

7. A method according to claim 5, including directing two ion beams coplanarly along intersecting paths via opposite open ends of said target and symmetrically with respect to said target, with said substrate being so located adjacent said cylindrical surface of said target as to receive substantial amounts of target material sputtered off by impingement of said ion beams on said target.

8. A method of sputter deposition as set forth in claim 5, wherein the target is electrically biased negatively to pull the ion beam circumferentially outwardly into contact with the lined material of the target.

9. A method of sputter deposition as set forth in claim 5, wherein the substrate is electrically biased positively to diverge the ion beam outwardly into contact with the lined material of the target.

10. A method of sputter deposition as set forth in claim 5, wherein the substrate is electrically biased negatively and the target is electrically biased negatively such that some of the ions impinge upon the substrate during sputter deposition to perform ion beam polishing.

11. A method of sputter deposition as set forth in claim 5, and including the step of first electrically biasing the substrate negatively and setting the target bias to ground potential for ion cleaning of the substrate.

* * * * *